(12) United States Patent
Weller et al.

(10) Patent No.: US 7,439,783 B2
(45) Date of Patent: Oct. 21, 2008

(54) PHASE-LOCKED LOOP SYSTEMS AND METHODS

(75) Inventors: Harald Weller, Bristol (GB); Ludmil Nikolov, Chippenham (GB); Ji Zhao, Saratoga, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/335,890

(22) Filed: Jan. 19, 2006

(65) Prior Publication Data

US 2007/0164799 A1 Jul. 19, 2007

(51) Int. Cl.
*H03L 7/06* (2006.01)

(52) U.S. Cl. ............... 327/157; 330/253; 375/374; 375/376

(58) Field of Classification Search ......... 327/147–148, 327/156–157, 359; 330/253–254, 258, 284; 331/17, 25; 375/373–376
See application file for complete search history.

(56) References Cited

U.S. PATENT DOCUMENTS

| | | | |
|---|---|---|---|
| 5,619,161 A | | 4/1997 | Novof et al. |
| 5,736,880 A | * | 4/1998 | Bruccoleri et al. ......... 327/157 |
| 5,936,445 A | * | 8/1999 | Babanezhad et al. ....... 327/157 |
| 5,994,951 A | * | 11/1999 | Mazhar et al. ............. 327/553 |
| 6,385,265 B1 | * | 5/2002 | Duffy et al. ................ 375/374 |
| 6,515,536 B2 | * | 2/2003 | Liang et al. ................ 327/537 |
| 6,686,794 B1 | * | 2/2004 | Abidin et al. .............. 327/537 |
| 6,744,292 B2 | * | 6/2004 | Chen et al. ................. 327/156 |
| 6,847,251 B2 | * | 1/2005 | Kao ........................... 327/536 |
| 6,876,244 B1 | * | 4/2005 | Moraveji ................... 327/374 |
| 7,081,781 B2 | * | 7/2006 | Zhu et al. ................... 327/157 |
| 7,177,613 B2 | * | 2/2007 | Kamath et al. ........... 455/278.1 |
| 7,184,510 B2 | * | 2/2007 | Jung .......................... 375/374 |
| 2003/0231037 A1 | * | 12/2003 | Lee et al. ................... 327/157 |
| 2005/0218948 A1 | | 10/2005 | Zhu et al. |

FOREIGN PATENT DOCUMENTS

GB 2410387 A 7/2005

OTHER PUBLICATIONS

International Search Report and Written Opinion of the ISA, mailed to applicant Apr. 7, 2008.

* cited by examiner

*Primary Examiner*—Lincoln Donovan
*Assistant Examiner*—William Hernandez

(57) ABSTRACT

Improved common mode feedback techniques are provided for charge pumps, phase-locked loops (PLLs), and other circuits. For example, in accordance with an embodiment of the present invention, a circuit includes a loop filter having first and second loop filter nodes. An amplifier is provided having first and second differential inputs respectively coupled to the first and second loop filter nodes. A first current source is coupled to the first loop filter node and a second current source is coupled to the second loop filter node. The first and second current sources continuously adjust a common mode voltage of the loop filter nodes.

11 Claims, 2 Drawing Sheets

PHASE-LOCKED LOOP SYSTEMS AND METHODS

TECHNICAL FIELD

The present invention relates generally to phase-locked loop (PLL) circuits, and more specifically to charge pumps used in connection with PLLs.

BACKGROUND

In a conventional phase-locked loop (PLL) circuit, a phase detector may provide signals to a charge pump in response to a reference signal and a feedback signal. Output voltages from loop filter nodes of the charge pump are provided to a voltage controlled oscillator (VCO) which increases or decreases the frequency of the feedback signal in response to the output voltages. As a result, the phase between the reference signal and feedback signal can be adjusted.

Typically, it is desirable to maintain a common mode voltage at the loop filter nodes in order to permit a satisfactory voltage swing on the inputs of the VCO. Unfortunately, when the PLL is in lock (i.e., when reference and feedback signals are in phase), conventional PLL charge pumps typically provide simultaneous current flow through both loop filter nodes only for short time periods (for example, 300 psec) which may correspond to a reset time associated with flip flops of the phase detector. In various applications, these short time periods can provide insufficient time for the charge pump to correct the common mode voltage at the loop filter nodes in order to keep the common mode voltage within desired limits.

As a result, the common mode voltage can drift. This drift is highly undesirable as it can saturate the output stage of the charge pump and the input stage of the VCO, thus severely affecting the overall performance of the PLL. Charge pump designs operating at relatively low frequencies, receiving low supply voltages, or providing small output currents suffer most from this problem. Accordingly, there is a need for an improved approach to charge pump circuitry with improved common mode voltage correction.

SUMMARY

In accordance with one embodiment of the present invention, a circuit includes a loop filter having first and second loop filter nodes; an amplifier having first and second differential inputs respectively coupled to the first and second loop filter nodes; a first current source coupled to the first loop filter node; and a second current source coupled to the second loop filter node, wherein the first and second current sources are adapted to continuously adjust a common mode voltage of the loop filter nodes.

In accordance with another embodiment of the present invention, a method of correcting a common mode voltage includes receiving a plurality of control signals responsive to a phase relationship between a reference signal and a feedback signal; coupling first and second loop filter nodes of a loop filter to first and second current sources in response to the control signals; and correcting a common mode voltage of the loop filter nodes independent of the control signals.

In accordance with another embodiment of the present invention, a circuit includes a loop filter having first and second loop filter nodes; means for selectively coupling current sources to the loop filter nodes in response to control signals; and means for correcting a common mode voltage of the loop filter nodes independent of the control signals.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of circuits and applications. As an exemplary implementation, a charge pump within a phase-locked loop (PLL) will be utilized to illustrate the techniques in accordance with one or more embodiments of the present invention. However, it should be understood that this is not limiting and that the techniques disclosed herein may be implemented as desired, in accordance with one or more embodiments of the present invention, within various types of circuits including but not limited to PLLs.

Figure 1:
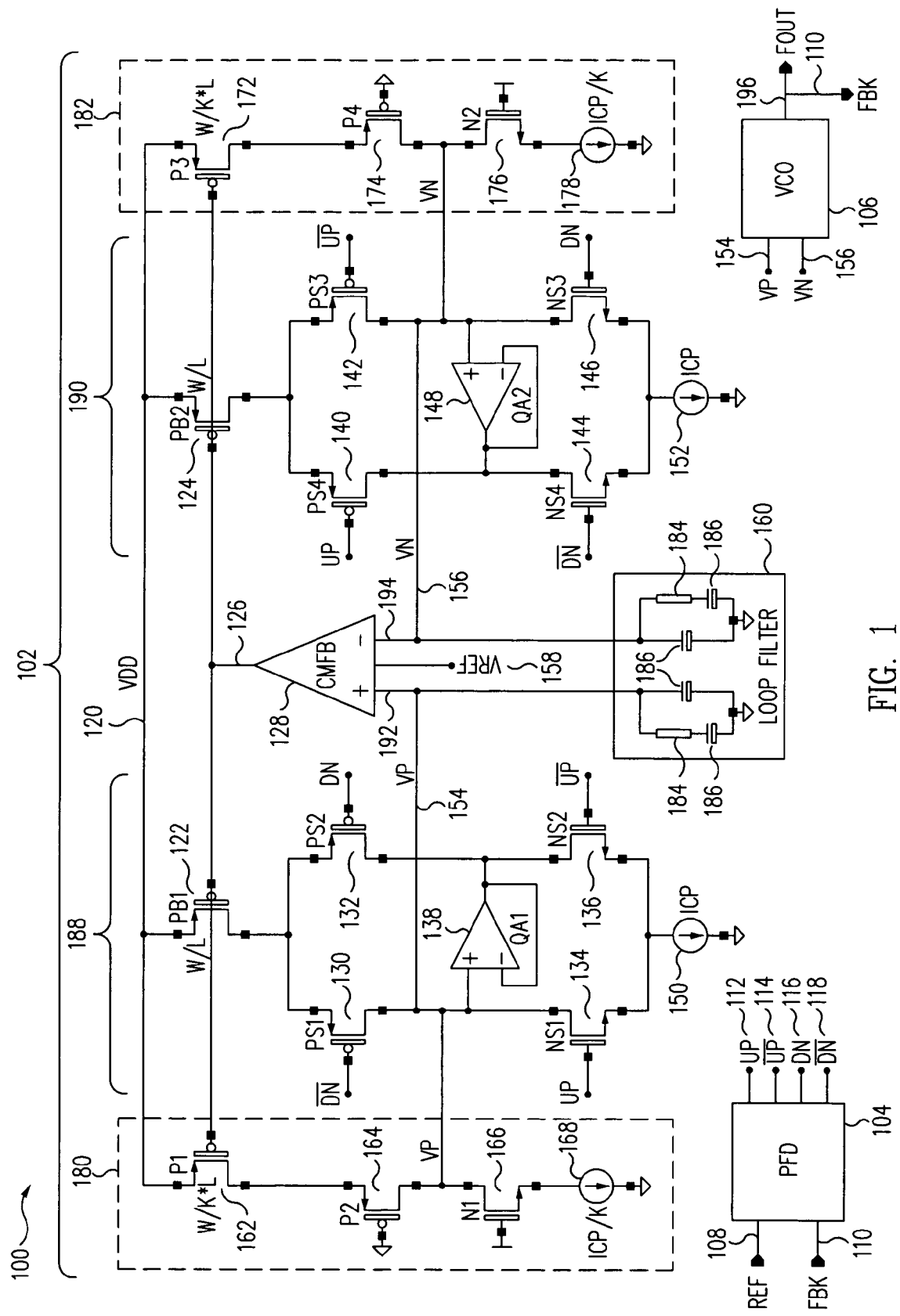
FIG. 1 illustrates an exemplary implementation of a phase-locked loop (PLL) circuit in accordance with an embodiment of the present invention.

FIG. 1 illustrates an exemplary implementation of a PLL 100 in accordance with an embodiment of the present invention. As set forth in FIG. 1, PLL 100 includes a charge pump 102, a phase detector 104, and a voltage controlled oscillator (VCO) 106.

Phase detector 104 may be implemented in accordance with any appropriate phase detector circuitry known in the art. In one embodiment, phase detector 104 is a dead-zone free phase frequency detector. Phase detector 104 receives a reference signal 108 (for example, a clock signal) as well as a feedback signal 110. In one embodiment, feedback signal 110 may be provided directly from an output signal 196 of VCO 106 as illustrated in FIG. 1. In another embodiment, output signal 196 may pass from VCO 106 through other circuitry (i.e., for clock injection removal) before being received by phase detector 104 as feedback signal 110. In response to reference signal 108 and feedback signal 110, phase detector 104 provides a plurality of control signals including UP signal 112, a complement 114 of the UP signal 112, a DN signal 116, and a complement 118 of the DN signal 116.

Charge pump 102 includes various conventional charge pump circuitry such as a common mode feedback (CMFB) amplifier 128, a loop filter 160, and circuit branches 188 and 190. In one embodiment, charge pump 102 can be implemented with switched (i.e., tri-stated) outputs. In accordance with an embodiment of the present invention, charge pump 102 further includes additional circuit branches 180 and 182 (denoted by dashed lines) coupled to nodes of loop filter 160 as will be further described herein.

Charge pump 102 receives a supply voltage 120 (labeled VDD) which is provided to transistors 122, 124, 162, and 172. The gates of each of transistors 122, 124, 162, and 172 are coupled to an output port 126 of CMFB amplifier 128. A reference voltage 158 (labeled VREF) is provided to CMFB amplifier 128. In one embodiment, reference voltage 158 is approximately one half of supply voltage 120.

Differential input ports 192 and 194 (labeled + and −) of amplifier 128 are coupled to loop filter nodes 154 and 156 (labeled VP and VN, respectively). Loop filter nodes 154 and 156 are each coupled to a loop filter 160 which may be implemented in a conventional fashion (e.g., with a plurality of resistors 184 and capacitors 186 as shown). Loop filter nodes 154 and 156 are also coupled as inputs to VCO 106.

VCO 106 may be implemented in accordance with any appropriate VCO circuitry known in the art. VCO 106 is responsive to voltages provided at loop filter nodes 154 and 156. For example, in one embodiment, VCO 106 can be implemented to increase the frequency of output signal 196 in response to voltage increases at loop filter node 154 and respective voltage decreases at loop filter node 156. VCO 106 can further be implemented to decrease the frequency of output signal 196 in response to voltage increases at loop filter node 156 and respective voltage decreases at loop filter node 154.

Turning now to the various circuit branches of charge pump 102, circuit branch 188 includes transistors 122, 130, 132, 134, and 136, a buffer 138, and a current source 150. Current to circuit branch 188 flows through transistor 122 which operates as a current source controlled by the voltage of output port 126 of CMFB amplifier 128. Transistor 122 is coupled to each of transistors 130 and 132 having gates receiving DN complement signal 118 and DN signal 116, respectively, from phase detector 104. Transistors 134 and 136 are coupled to transistors 130 and 132 having gates receiving UP signal 112 and UP complement signal 114, respectively, from phase detector 104. As illustrated, transistors 130 and 134 are also coupled to loop filter node 154. A current source 150 is coupled to each of transistors 134 and 136, and a buffer 138 is coupled between transistors 130, 132, 134, and 136 as shown.

Circuit branch 190 includes transistors 124, 140, 142, 144, and 146, a buffer 148, and a current source 152. Current to circuit branch 190 flows through transistor 124 which operates as a current source controlled by the voltage of output port 126 of CMFB amplifier 128. Transistor 124 is coupled to each of transistors 140 and 142 having gates receiving UP signal 112 and UP complement signal 114, respectively, from phase detector 104. Transistors 144 and 146 are coupled to transistors 140 and 142 having gates receiving DN complement signal 118 and DN signal 116, respectively, from phase detector 104. As illustrated, transistors 142 and 146 are coupled to loop filter node 156. A current source 152 is coupled to transistors 144 and 146, and a buffer 148 is coupled between transistors 140, 142, 144, and 146 as shown.

Circuit branch 180 includes transistors 162, 164, and 166, and a current source 168. Current (for example, approximately 20 μA) to circuit branch 180 flows through transistor 162 which operates as a current source controlled by the voltage of output port 126 of CMFB amplifier 128. As illustrated, transistor 162 is coupled to transistor 164 having a gate coupled to ground which causes transistor 164 to remain in an "on" state. Transistor 166 is coupled to transistor 166 having a gate coupled to supply voltage 120 which causes transistor 166 to also remain in an "on" state. Transistors 164 and 166 are also coupled to loop filter node 154. Transistor 166 is coupled to current source 168 which, for example, may be implemented as an n-channel transistor (not shown). Accordingly, it will be appreciated that circuit branch 180 operates to continuously draw current from loop filter node 154.

Circuit branch 182 includes transistors 172, 174, and 176, and a current source 178. Current (for example, approximately 20 μA) to circuit branch 182 flows through transistor 172 which operates as a current source controlled by the voltage of output port 126 of CMFB amplifier 128. As illustrated, transistor 172 is coupled to transistor 174 having a gate coupled to ground which causes transistor 174 to remain in an "on" state. Transistor 174 is coupled to transistor 176 having a gate coupled to supply voltage 120 which causes transistor 176 to also remain in an "on" state. Transistors 174 and 176 are also coupled to loop filter node 156. Transistor 176 is coupled to current source 178 which, for example, may be implemented as an n-channel transistor (not shown). Accordingly, it will be appreciated that circuit branch 182 operates to continuously draw current from loop filter node 156.

In various embodiments, transistors 162, 164, and 166, and current source 168 of circuit branch 180 may be implemented as scaled versions of transistors 122, 130, 134, and current source 150 of circuit branch 188, respectively. Similarly, transistors 172, 174, and 176, and current source 178 of circuit branch 182 may be implemented as scaled versions of transistors 124, 142, 146, and current source 152 of circuit branch 190, respectively.

For example, the width of channel regions of the transistors of circuit branches 180 and 182 may be scaled down by a factor K in relation to corresponding transistors of circuit branches 188 and 190. The current sourced through current sources 168 and 178 may also be scaled down in relation to that of current sources 150 and 152 by the same factor K. In one embodiment, K is in the range of approximately 8 to 10. As a result, it will be appreciated that in such an embodiment, the current passing through each of circuit branches 180 and 182 can be approximately 1/K of the current passing through each of circuit branches 188 and 190.

In one embodiment, the various components of circuit branches 180 and 182 may be implemented as extensions of components of circuit branches 188 and 190, respectively. For example, each of transistors 122, 130, and 134, and current source 150 of circuit branch 188 can be implemented as several unit devices connected in parallel to generate transistors of large channel widths. Each of transistors 162, 164, and 166, and current source 168 can be implemented as single unit devices such that circuit branch 180 becomes a scaled down extension of circuit branch 188. It will be appreciated that circuit branches 190 and 182 can be similarly scaled.

Figure 2:
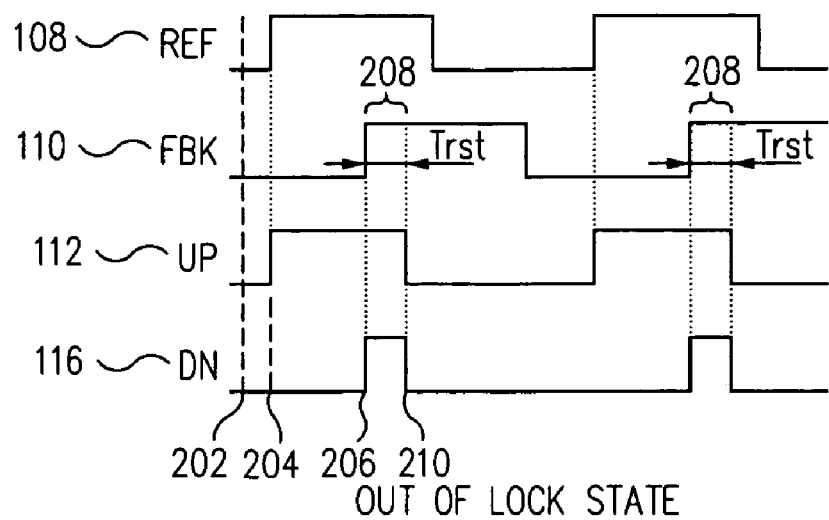
FIG. 2 illustrates a timing diagram of a phase detector receiving out-of-phase signals in accordance with an embodiment of the present invention.
Figure 3:
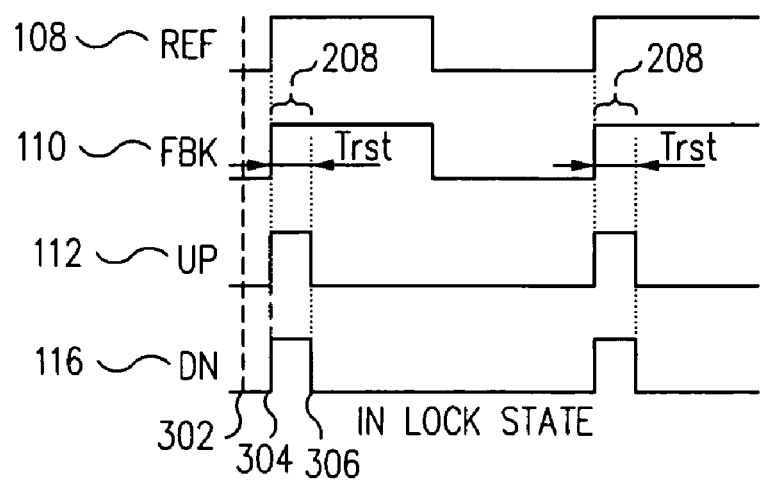
FIG. 3 illustrates a timing diagram of a phase detector receiving in-phase signals in accordance with an embodiment of the present invention.

FIG. 2 illustrates a timing diagram of phase detector 104 where reference signal 108 and feedback signal 110 are out of phase in accordance with an embodiment of the present invention. FIG. 3 illustrates a timing diagram of phase detector 104 where reference signal 108 and feedback signal 110 are in phase in accordance with an embodiment of the present invention.

As set forth in the timing diagrams of FIGS. 2 and 3, phase detector 104 will provide a logical high value for UP signal 112 in response to a leading edge of reference signal 108 (at times 204 and 304). Similarly, phase detector 104 will provide a logical high value for DN signal 116 in response to a leading edge of feedback signal 110 (at times 206 and 304).

When both reference signal 108 and feedback signal 110 are at logical high values, UP signal 112 and DN signal 116 will be reset to logical low values after a brief time period 208 (labeled Trst in FIGS. 2 and 3). For example, in one embodiment, time period 208 may correspond to a reset time of approximately 300 psec associated with flip flops of phase detector 104. It will be noted that, regardless of whether reference signal 108 and feedback signal 110 are out of phase (FIG. 2) or in phase (FIG. 3), UP signal 112 and DN signal 116 will simultaneously remain at logical high values only for the duration of time periods 208.

The switching of various transistors of charge pump 102 will now be further described with reference to the timing diagrams of FIGS. 2 and 3. Turning to FIG. 2, when both reference signal 108 and feedback signal 110 are at logical low values (at time 202), UP signal 112 and DN signal 116 will be at logical low values while UP compliment signal 114 and DN complement signal 118 are at logical high values. As a result, transistors 130, 134, 142, and 146 will be off, and transistors 132, 136, 140 will be on. At this time, loop filter nodes 154 and 156 are effectively isolated from current sources 150 and 152.

When reference signal 108 transitions to a logical high value (at time 204), UP signal 112 will transition to a logical high value and UP complement signal 114 will transition to a logical low value. As a result, transistors 134 and 142 will turn on, transistors 136 and 140 will turn off, and voltage from loop filter node 154 can be dissipated by current source 150 through transistor 134 as current source 150 is coupled to loop filter node 154 through transistor 134.

When feedback signal 110 also transitions to a logical high value (at time 206), DN signal 116 will transition to a logical high value and DN complement signal 118 will transition to a logical low value. As a result, transistors 130 and 146 will turn on, transistors 132 and 144 will turn off, and voltage from loop filter node 156 can be dissipated by current source 152 through transistor 146 as current source 152 is coupled to loop filter node 156 through transistor 146.

After time period 208 has elapsed (at time 210), UP signal 112 and DN signal 116 will transition to logical low values, and UP complement signal 114 and DN complement signal 118 will transition to logical high values. As a result, transistors 130, 134, 142, and 146 will turn off, transistors 132, 136, 140, and 144 will turn on, and both of loop filter nodes 154 and 156 will again be isolated from current sources 150 and 152.

Turning to FIG. 3, when both reference signal 108 and feedback signal 110 are at logical low values (at time 302), transistors 130, 134, 142, and 146 will be off, and transistors 132, 136, 140, and 144 will be on as previously discussed in relation to FIG. 2. Loop filter nodes 154 and 156 will also be effectively isolated from current sources 150 and 152 at this time.

When both reference signal 108 and feedback signal 110 transition to logical high values (at time 304), transistors 130, 134, 142, and 146 will turn on, transistors 132, 136, 140, and 144 will turn off, and voltage from loop filter nodes 154 and 156 can be dissipated by current sources 150 and 152, respectively, as previously discussed in relation to FIG. 2.

After time period 208 has elapsed (at time 306), transistors 130, 134, 142, and 146 will turn off, transistors 132, 136, 140, and 144 will turn on, and both of loop filter nodes 154 and 156 will again be isolated from current sources 150 and 152 as previously discussed in relation to FIG. 2.

In view of the above discussion, it will be appreciated that current sources 150 and 152 will only operate simultaneously to pull down the common mode voltage of loop filter nodes 154 and 156 during the brief time period 208, regardless of whether reference signal 108 and feedback signal 110 are in phase. However, with circuit branches 180 and 182 coupled to loop filter nodes 154 and 156, a continuous current will flow through circuit branches 180 and 182 independent of the state of the various signals provided by phase detector 104. As a result, the common mode voltage at loop filter nodes 154 and 156 can be continuously corrected during the whole period of reference signal 108, thereby allowing CMFB amplifier 128 to quickly adjust the common mode voltage during the whole period of reference signal 108. As such, circuit branches 180 and 182 allow for continuous common mode voltage correction, rather than limiting such correction to only the narrow time periods 208 typical for conventional charge pump implementations.

Advantageously, circuit branches 180 and 182 can be added to differential charge pumps or PLLs without requiring modifications to other aspects of the charge pump (such as loop filter 160), phase detector 104, or VCO 106. It will be appreciated that the improved charge pump design described herein may be incorporated into circuits having a variety of applications including cascode current mirrors, low voltage current mirrors, transmission gate switches, and others.

Variations in the disclosed embodiments are also contemplated. For example, in one embodiment, transistor 130 may alternatively be connected between supply voltage 120 and transistor 122, with transistor 122 connected to loop filter node 154. In such an arrangement, circuit branch 180 could also be modified such that transistor 164 is connected between supply voltage 120 and transistor 162, with transistor 162 connected to loop filter node 154. It will be appreciated that circuit branches 190 and 182 can be similarly modified.

Embodiments described above illustrate but do not limit the invention. It should also be understood that numerous modifications and variations are possible in accordance with the principles of the present invention. Accordingly, the scope of the invention is defined only by the following claims.

We claim:

1. A phase-locked loop (PPL) circuit comprising
 a phase detector adapted to receive a reference signal and a feedback signal and in response provide a plurality of control signals including an UP signal and a DN signal;
 a voltage controlled oscillator adapted to provide at an output the feedback signal for the phase detector; and
 charge pump coupled between the phase detector and the VCO, the charge pump comprising:
   a loop filter having first and second loop filter nodes coupled to inputs of the VCO;
   an amplifier having an output and first and second differential inputs respectively coupled to the first and second loop filter nodes;
   a first current source coupled to the amplifier output and the first loop filter node;
   a second current source coupled to the amplifier output and the second loop filter node,
   wherein the first and second current sources are responsive to the amplifier output to continuously adjust a common mode voltage of the loop filter nodes in response to a signal received from the amplifier output;
   a third current source coupled to the first loop filter node and controlled by the control signals of the phase detector; and
   a fourth current source coupled to the second filter node and controlled by the control signals of the phase detector,
   wherein the third and fourth current sources are electrically isolated from the loop filter nodes if the UP and UN signals are not asserted by the phase detector.

2. The PLL of claim 1, wherein the third current source is part of a first PLL circuit branch that includes two current paths, a first path that electrically connects the third current source to the first loop node, and a second path that electrically isolates the third current source from the first loop filter node, the first path adapted to be selected if the UP signal is asserted and the second path adapted to be selected if the UP and DN signals are not asserted.

3. The PLL of claim 2, wherein the first path includes a first transistor coupled to receive the UP signal and a second transistor coupled to receive the complement of the DN signal, and the second path includes a first transistor coupled to receive the complement of the UP signal and a second transistor coupled to receive the DN signal.

4. The PLL of claim 2, wherein the first PLL circuit branch is coupled to the amplifier output.

5. The PLL of claim 1, wherein the fourth current source is part of a second PLL circuit branch that includes two current paths, a first path that electrically connects the fourth current source to the second loop node, and a second path that electrically isolates the fourth current source from the second loop filter node, the first path adapted to be selected if the DN signal is asserted and the second path adapted to be selected if the UP and DN signals are not asserted.

6. The PLL of claim 5, wherein the first path includes a first transistor coupled to receive the DN signal and a second transistor coupled to receive the complement of the UP signal, and the second path includes a first transistor coupled to receive the complement of the DN signal and a second transistor coupled to receive the UP signal.

7. The PLL of claim 5, wherein the second PLL circuit branch is coupled to the amplifier output.

8. The PLL of claim 1, wherein the amplifier is a common mode feedback (CMFB) amplifier.

9. A phase-locked loop (PPL) circuit comprising
a phase detector adapted to receive a reference signal and a feedback signal and in response provide a plurality of control signals including an UP signal and a DN signal;
a voltage controlled oscillator adapted to provide at an output the feedback signal for the phase detector; and
a charge pump coupled between the phase detector and the VCO, the charge pump comprising:
a loop filter having first and second loop filter nodes coupled to inputs of the VCO;
an amplifier having an output and first and second differential inputs respectively coupled to the first and second loop filter nodes;
a first current source coupled to the amplifier output and the first loop filler node;
a second current source coupled to the amplifier output and the second loop filter node,
wherein the first and second current sources are responsive to the amplifier output to continuously adjust a common mode voltage of the loop filter nodes in response to a signal received from the amplifier output;
a third current source coupled to the first loop filter node and controlled by the control signals of the phase detector; and
a fourth current source coupled to the second filter node and controlled by the control signals of the phase detector,
wherein:
the third and fourth current sources are electrically connected to the loop filter nodes lithe UP and DN signals are asserted by the phase detector;
the third current source is electrically connected to the first loop filter node and the fourth current source is electrically isolated from the second loop filter node if the UP signal is asserted and the DN signal is not asserted by the phase detector;
the third current source is electrically isolated from the first loop filter node and the fourth current source is electrically connected to the second loop filter node if the UP signal is not asserted and the DN signal is asserted by the phase detector; and
the third and fourth current sources are electrically isolated from the loop filter nodes if the UP and DN signals are not asserted by the phase detector.

10. The PLL of claim 9, wherein the amplifier is a common mode feedback (CMFB) amplifier.

11. A phase-locked loop (PPL) circuit comprising
a phase detector adapted to receive a reference signal and a feedback signal and in response provide a plurality of control signals including an UP signal and a DN signal;
a voltage controlled oscillator adapted to provide at an output the feedback signal for the phase detector; and
a charge pump coupled between the phase detector and the VCO, the charge pump comprising:
a loop filter having first and second loop filter nodes coupled to inputs of the VCO;
an amplifier having an output and first and second differential inputs respectively coupled to the first and second loop filter nodes;
first means responsive to the amplifier output for continuously adjusting a common mode voltage of the loop filter nodes; and
second means responsive to the phase detector control signals for adjusting the differential voltage of the loop filter nodes, the second means being electrically isolated from the loop filter nodes if the UP and DN signals are not asserted by the phase detector.

* * * * *

UNITED STATES PATENT AND TRADEMARK OFFICE
CERTIFICATE OF CORRECTION

PATENT NO. : 7,439,783 B2
APPLICATION NO. : 11/335890
DATED : October 21, 2008
INVENTOR(S) : Harald Weller et al.

It is certified that error appears in the above-identified patent and that said Letters Patent is hereby corrected as shown below:

Col. 6, line 34 (Claim 1) change: "A phase-locked loop (PPL) circuit comprising" to
-- A phase-locked loop (PLL) circuit comprising: --

Col. 6, line 38 (Claim 1) change: "a voltage controlled oscillator adapted to provide" to
-- a voltage controlled oscillator (VCO) adapted to provide --

Col. 6, line 64 (Claim 1) change: "UN signals are not asserted by the phase detector." to
-- DN signals are not asserted by the phase detector. --

Col. 7, line 32 (Claim 9) change: "A phase-locked loop (PPL) circuit comprising" to
-- A phase-locked loop (PLL) circuit comprising: --

Col. 7, line 36 (Claim 9) change: "a voltage controlled oscillator adapted to provide" to
-- a voltage controlled oscillator (VCO) adapted to provide --

Col. 8, line 29 (Claim 11) change: "A phase-locked loop (PPL) circuit comprising" to
-- A phase-locked loop (PLL) circuit comprising: --

Col. 8, line 33 (Claim 11) change: "a voltage controlled oscillator adapted to provide" to
-- a voltage controlled oscillator (VCO) adapted to provide --

Signed and Sealed this

First Day of December, 2009

David J. Kappos
*Director of the United States Patent and Trademark Office*